(12) United States Patent
Ge

(10) Patent No.: US 11,860,493 B2
(45) Date of Patent: Jan. 2, 2024

(54) DISPLAY PANEL AND DISPLAY DEVICE

(71) Applicant: Shenzhen China Star Optoelectronics Semiconductor Display Technology Co., Ltd., Guangdong (CN)

(72) Inventor: Xianjin Ge, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 557 days.

(21) Appl. No.: 17/254,928

(22) PCT Filed: Dec. 15, 2020

(86) PCT No.: PCT/CN2020/136300
§ 371 (c)(1),
(2) Date: Dec. 22, 2020

(87) PCT Pub. No.: WO2022/116263
PCT Pub. Date: Jun. 9, 2022

(65) Prior Publication Data
US 2023/0024337 A1 Jan. 26, 2023

(30) Foreign Application Priority Data
Dec. 1, 2020 (CN) .......................... 202011385623.7

(51) Int. Cl.
*G02F 1/1362* (2006.01)
*H01L 27/12* (2006.01)

(52) U.S. Cl.
CPC .. *G02F 1/136286* (2013.01); *G02F 1/136222* (2021.01); *H01L 27/1248* (2013.01); *G02F 2201/40* (2013.01); *G02F 2201/50* (2013.01)

(58) Field of Classification Search
CPC ......... G02F 1/136286; G02F 1/136222; G02F 2201/40; G02F 2201/50; G02F 1/136218;
(Continued)

(56) References Cited

U.S. PATENT DOCUMENTS 9,041,002 B2 * 5/2015 Lv ..................... H01L 27/124
257/59
2011/0255045 A1 * 10/2011 Son .................. G02F 1/136286
349/139

(Continued)

FOREIGN PATENT DOCUMENTS

CN 103293802 9/2013
CN 104238207 12/2014
(Continued)

*Primary Examiner* — J. E. Schoenholtz

(57) ABSTRACT

The present invention is about display technology. A display panel and a display device are provided. The display panel includes: a substrate layer; a data line arranged on the substrate layer; a color resist layer which is arranged on the substrate layer and located at two sides of the data line, and includes grooves which are located at least at one side of the data line; a shielding layer arranged on the color resist layer and arranged over the data line; a pixel electrode layer arranged over the shielding layer; and a passivation layer arranged between the shielding layer and the pixel electrode layer and covering the shielding layer and the color resist layer.

20 Claims, 2 Drawing Sheets

(58) Field of Classification Search
CPC ............. G02F 1/133514; G02F 1/1362; H01L 27/1248; H01L 27/124
See application file for complete search history.

(56) References Cited

U.S. PATENT DOCUMENTS

| | | | |
|---|---|---|---|
| 2017/0139300 A1* | 5/2017 | Itoh | ................. H01L 27/1225 |
| 2021/0286221 A1* | 9/2021 | Suri | ................. G02F 1/1368 |
| 2022/0113600 A1* | 4/2022 | Zhang | ............... G02F 1/136227 |
| 2023/0104249 A1* | 4/2023 | Zhang | ................ G02F 1/13439 |
| | | | 349/33 |

FOREIGN PATENT DOCUMENTS

| | | | | |
|---|---|---|---|---|
| CN | 104614910 | | 5/2015 | |
| CN | 104880879 | | 9/2015 | |
| CN | 108231850 | | 6/2016 | |
| CN | 207265054 | | 4/2018 | |
| CN | 208848008 | | 5/2019 | |
| CN | 110858037 | | 3/2020 | |
| CN | 111090203 | | 5/2020 | |
| CN | 111290182 | | 6/2020 | |
| KR | 10-2012-0129644 | | 11/2012 | |
| KR | 10-2017-0137994 | | 12/2017 | |
| TW | 201241529 | | 10/2012 | |
| WO | WO-2021189575 A1 * | 9/2021 | ....... G02F 1/134309 |

* cited by examiner

DISPLAY PANEL AND DISPLAY DEVICE

RELATED APPLICATIONS

This application is a National Phase of PCT Patent Application No. PCT/CN2020/136300 having International filing date of Dec. 15, 2020, which claims the benefit of priority of Chinese Patent Application No. 202011385623.7 filed on Dec. 1, 2020. The contents of the above applications are all incorporated by reference as if fully set forth herein in their entirety.

FIELD AND BACKGROUND OF THE INVENTION

The present invention relates to a field of display technology and in particular, to a display panel and a display device.

With the development and progress of science and technology, liquid crystal display panels have been widely used. Most of the liquid crystal display panels on the market are backlit liquid crystal display panels, which include liquid crystal panels and backlight modules. The working principle of the liquid crystal display panel is to fill liquid crystal molecules between a thin film transistor array substrate and a color filter substrate, and apply a driving voltage to the two substrates to control a rotation direction of the liquid crystal molecules, so as to refract the light from the backlight module to produce images.

The thin film transistor array substrate includes multiple gate lines and data lines. The gate lines and the data lines are perpendicular to each other to form multiple pixel units, and each pixel unit is provided with a thin film transistor, a pixel electrode, and a storage capacitor. When the gate line is driven, the thin film transistor is turned on, and a gray-scale voltage signal containing corresponding data is loaded to the pixel electrode, so that a corresponding electric field is generated between the pixel electrode and a common electrode. The orientation of the liquid crystal molecules changes under the action of an electric field to achieve different image displays.

Conventional liquid crystal display panels usually have a crosstalk problem. The main reason is that coupling capacitance (Cpd) between a pixel electrode and a data signal line is overly high, so a potential of a pixel is affected by a data signal, thereby causing variations in brightness. As resolution of liquid crystal display panels becomes higher and higher, a pixel size is getting smaller and smaller. Especially in 8K display panels, a thickness of the data signal line increases, and as a result, the Cpd increases, and the vertical crosstalk is more serious. By increasing a distance between the data signal line and the pixel electrode, the Cpd does decrease, but this approach also causes a loss in an aperture ratio of the pixel and thus lowers the transmittance of the liquid crystal display panel.

SUMMARY OF THE INVENTION

The present invention provides a display panel and a display device to improve a vertical crosstalk problem of the display panel and increase an aperture ratio of a pixel.

The present invention provides a display panel, comprising:
a substrate layer;
a data line arranged on the substrate layer;
a color resist layer disposed on the substrate layer, wherein the color resist layer is located at two sides of the data line and comprises a plurality of grooves, and the plurality of grooves are located at least at one side of the data line;
a shielding layer disposed on the color resist layer and arranged over the data line; and
a pixel electrode layer arranged over the color resist layer and the shielding layer.

According to one embodiment of the present invention, the color resist layer located at two sides of the data line extends to above the data line to cover the same.

According to one embodiment of the present invention, the display panel comprises one or more than one groove, and the plurality of grooves are at least located above one side of the data line.

According to one embodiment of the present invention, the shielding layer covers at least a portion of an inner surface of the groove in a conforming manner according to a shape of the groove.

According to one embodiment of the present invention, a projection of the shielding layer projected on the substrate layer covers at least a portion of a projection of the data line projected on the substrate layer.

According to one embodiment of the present invention, the projection of the shielding layer projected on the substrate layer covers the whole projection of the data line projected on the substrate layer.

According to one embodiment of the present invention, a depth of the groove is less than a thickness of the color resist layer located at the two sides of the data line.

According to one embodiment of the present invention, the pixel electrode layer comprises a plurality of pixel electrodes, and a projection of the plurality of pixel electrodes projected on the substrate layer at least partially overlaps with a projection of the shielding layer projected on the substrate layer.

According to one embodiment of the present invention, the display panel further comprises a passivation layer which is disposed between the shielding layer and the pixel electrode layer and covers the shielding layer and the color resist layer.

According to one embodiment of the present invention, the display panel further comprises a protective layer which is disposed on the substrate layer and covers the data line.

The present invention provides a display device, the display device comprising a display panel, the display panel comprising:
a substrate layer;
a data line arranged on the substrate layer;
a color resist layer disposed on the substrate layer, wherein the color resist layer is located at two sides of the data line and comprises a plurality of grooves, and the plurality of grooves are located at least at one side of the data line;
a shielding layer disposed on the color resist layer and arranged over the data line; and
a pixel electrode layer arranged over the color resist layer and the shielding layer.

According to one embodiment of the present invention, the color resist layer located at the two sides of the data line extends to above the data line to cover the same.

According to one embodiment of the present invention, the display device comprises one or more than one groove, and the plurality of grooves are at least located above one side of the data line.

According to one embodiment of the present invention, the shielding layer covers at least a portion of an inner surface of the groove in a conforming manner according to a shape of the groove.

According to one embodiment of the present invention, a projection of the shielding layer projected on the substrate layer covers at least a portion of a projection of the data line projected on the substrate layer.

According to one embodiment of the present invention, the projection of the shielding layer projected on the substrate layer covers the whole projection of the data line projected on the substrate layer.

According to one embodiment of the present invention, a depth of the groove is less than a thickness of the color resist layer located at the two sides of the data line.

According to one embodiment of the present invention, the pixel electrode layer comprises a plurality of pixel electrodes, and a projection of the plurality of pixel electrodes projected on the substrate layer at least partially overlaps with a projection of the shielding layer projected on the substrate layer.

According to one embodiment of the present invention, the display panel further comprises a passivation layer which is disposed between the shielding layer and the pixel electrode layer and covers the shielding layer and the color resist layer.

According to one embodiment of the present invention, the display panel further comprises a protective layer which is disposed on the substrate layer and covers the data line.

Compared with conventional techniques, the display panel and the display device of the present invention have the following advantages. By having the plurality of grooves in the color resist layer on at least one side of the data line, a thickness of the color resist layer is reduced. Further, the shielding layer is disposed above the data line to effectively reduce coupling capacitance, thereby improving a vertical crosstalk problem of the display panel. The passivation layer is arranged between the shielding layer and the pixel electrode layer to separate the shielding layer from the pixel electrode layer, thereby improving an aperture ratio of a pixel.

BRIEF DESCRIPTION OF THE SEVERAL
VIEWS OF THE DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

Figure 1:
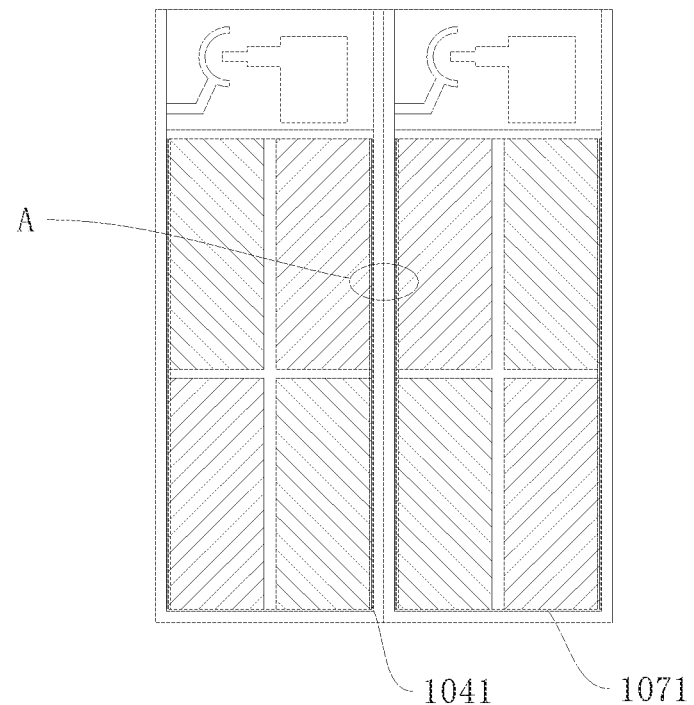
FIG. 1 is a schematic top view illustrating a pixel unit of a display panel provided according to one embodiment of the present invention.

DESCRIPTION OF SPECIFIC EMBODIMENTS
OF THE INVENTION

The technical solutions in the present application will be clearly and completely described below in conjunction with the accompanying drawings with reference to the embodiments of the present application. Obviously, the described embodiments are only some of the embodiments of the present application, rather than all of the embodiments. Based on the embodiments in the present application, all other embodiments obtained by those skilled in the art without inventiveness fall within the protection scope of the present application.

In the description of the present application, it should be noted that the directional terms, such as "center", "longitudinal", "transverse", "length", "width", "thickness", "upper", "lower", "front", "rear", "left", "right", "vertical", "horizontal", "top", "bottom", "inner", "outer", "clockwise", and "counterclockwise", are based on the orientation or positional relationship shown in the drawings, and are only for the convenience of describing the present application and simplifying the description. The directional terms do not indicate or imply that the device or element referred to must have a specific orientation, be constructed and operated in a specific orientation. Therefore, they cannot be understood as a restriction on the present application. In addition, the terms "first" and "second" are only used for descriptive purposes, and cannot be understood as indicating or implying relative importance or implicitly indicating the number of indicated technical features. Therefore, the features defined with "first" and "second" may explicitly or implicitly include one or more of the features. In the description of the present application, "multiple" means two or more than two, unless otherwise specifically defined.

In the description of this application, it should be noted that, unless otherwise clearly specified and limited, the terms "mounted to", "connected to" and "coupled to" should be understood in a broad sense. For example, two elements are fixedly connected, detachably connected, or integrally connected to each other; two elements can be mechanically connected, or electrically connected, or can communicate with each other; two elements can be directly connected or indirectly connected through an intermediate medium; and two elements can internally communicate with each other or interact with each other. For those of ordinary skill in the art, the specific meanings of the above-mentioned terms in the present application can be understood on a case-by-case basis.

In the present application, unless expressly specified and defined otherwise, a first element being "above" or "below" a second element can mean that the first element is in direct contact with the second element, or the first element and the second element are not in direct contact with each other but contact through other element between them. Moreover, the first element being "above", "over" and "on" the second element can mean that the first element is right above and obliquely over the second element, or can simply mean that the first element is higher in level than the second element. The first element being "below", "under" and "underneath" the second element can mean that the first element being directly under or obliquely below the second element, or can simply mean that the first element is lower in level than the second element.

The following disclosure provides many different embodiments or examples for realizing different structures of the present application. In order to simplify the disclosure of the present application, the components and configurations of specific examples are described below. Certainly, they are only examples and are not intended to limit the present application. In addition, reference numerals and/or reference letters can be repeated in different examples of the present application. Such repetition is for the purpose of simplification and clarity, and does not indicate the relationship between the various embodiments and/or configurations discussed. In addition, the present application provides examples of various specific processes and materials, but those of ordinary skill in the art may be aware of the use of other processes and/or the use of other materials.

The present invention is directed to solving a problem of conventional display panels. The problem is that a vertical crosstalk problem in conventional display panels tends to be serious as a pixel size is reduced, and an aperture ratio of the pixel has a great loss by increasing a distance between a data line and a pixel electrode to reduce coupling capacitance. Embodiments of the present invention are used to solve this problem.

Figure 2:
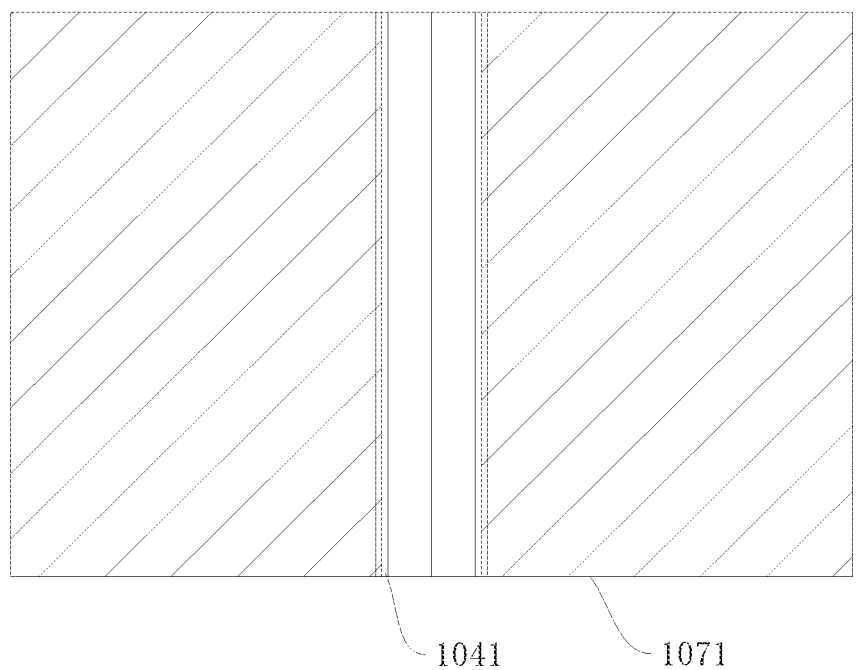
FIG. 2 is a partial enlarged schematic view illustrating portion A in FIG. 1.
Figure 3:
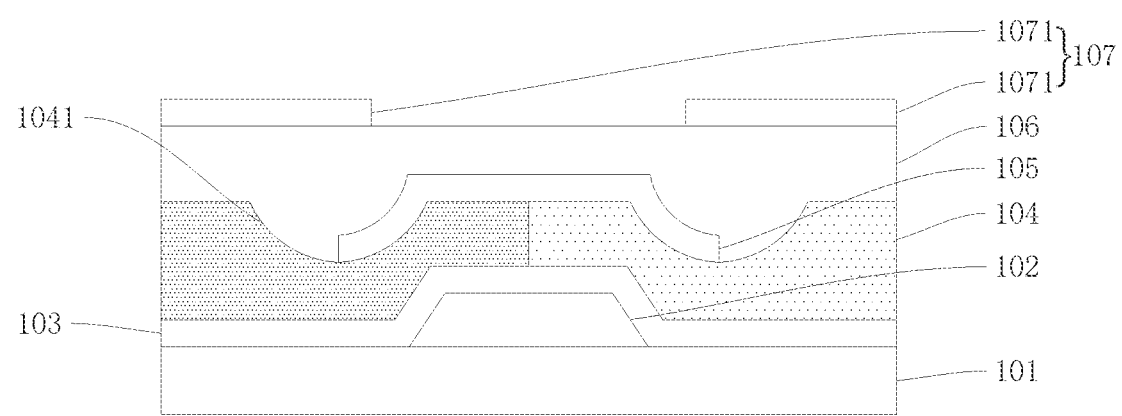
FIG. 3 is a schematic cross-sectional view illustrating portion A in FIG. 1.

FIG. 1 is a schematic top view illustrating a pixel unit of a display panel according to one embodiment of the present invention. FIG. 2 is a partial enlarged view illustrating portion A in FIG. 1. FIG. 3 is a cross-sectional view illustrating portion A in FIG. 1. Referring to FIGS. 1 to 3, the present invention provides a display panel, comprising: a substrate layer 101; a data line 102 arranged on the substrate layer 101; a color resist layer 104 disposed on the substrate layer 101, wherein the color resist layer 104 is located at two sides of the data line 102 and comprises a plurality of grooves 1041, and the grooves 1041 are located at least at one side of the data line 102; a shielding layer 105 disposed on the color resist layer 104 and located over the data line 102; and a pixel electrode layer 107 arranged over the color resist layer 104 and the shielding layer 105.

In the present embodiment, the substrate layer 101 can comprise a thin film transistor (TFT) device, and the TFT device includes a source, a drain, an active layer, and a gate. The data line 102 is connected to the source, and the pixel electrode layer 107 is connected to the drain.

Preferably, the color resist layer 104 can include multiple color resist sub-layers, and the color resist sub-layers can be red color resist layers, green color resist layers, or blue color resist layers. Referring to FIG. 3, filling patterns of different density can indicate different color resist sub-layers. For example, the color resist sub-layer on a left side of the drawing is a red color resist layer, and the color resist sub-layer on a right side of the drawing is a green color resist layer.

Preferably, the color resist layer 104 is located at two sides of the data line 102 and extends to above the data line 102 to cover the data line 102. Specifically, the color resist sub-layers are located at the two sides of the data line 102 and extend to above the data line 102 and cover the data line 102.

Furthermore, the number of the grooves 1041 defined in the color resist layer 104 is greater than or equal to 1, and the grooves 1041 are at least located above one side of the data line 102. As shown in FIG. 3, in the present embodiment, the number of the grooves 1041 is two, and they are symmetrically distributed above the two sides of the data line 102. Those skilled in the art can understand that, in other embodiments of the present invention, the number of the grooves 1041 is not limited, and can be located asymmetrically above at least one side of the data line 102.

Preferably, the display panel of the present embodiment further comprises a passivation layer 106 which is disposed between the shielding layer 105 and the pixel electrode layer 107, and covers the shielding layer 105 and the color resist layer 104.

In the display panel of the present embodiment, the groove 1041 is defined in the color resist layer 104, and the groove 1041 is located above at least one side of the data line 102, so that the color resist layer 104 located on at least one side of the data line 102 is thinned to cause the shielding layer 105 to have an improved shielding effect on the data line 102, thus reducing coupling capacitance between the data line 102 and the pixel electrode layer 107, and improving a vertical crosstalk problem in the display panel. Further, the passivation layer 106 is disposed between the shielding layer 105 and the pixel electrode layer 107 to separate the shielding layer 105 from the pixel electrode layer 107, thus effectively avoiding a short circuit between the shielding layer 105 and the pixel electrode layer 107, thereby effectively reducing a distance between the shielding layer 105 and the pixel electrode layer 107 and improving an aperture ratio of a pixel.

Moreover, the pixel electrode layer 107 comprises a plurality of pixel electrodes 1071, and a projection of the plurality of pixel electrodes 1071 projected on the substrate layer 101 at least partially overlaps with a projection of the shielding layer 105 projected on the substrate layer 101.

Specifically, the shielding layer 105 and the pixel electrode layer 107 can be made of indium tin oxide (ITO). In a conventional display panel, the shielding layer 105 and the pixel electrode layer 107 are normally made of a same ITO film. In order to prevent short-circuiting from occurring between the shielding layer 105 and the pixel electrode layer 107 to cause display abnormalities, it is necessary to ensure that a distance between the shielding layer 105 and the pixel electrode layer 107 is greater than or equal to 4 um. This distance limitation reduces the aperture ratio of the pixel. In the embodiment of the present invention, the shielding layer 105 and the pixel electrode layer 107 are separated by the passivation layer 106, so that the shielding layer 105 and the pixel electrode layer 107 are in two different layers, and the risk of a short circuit between the two layers is also greatly reduced. As a result, it is no longer necessary to meet the original limitation of the distance between the two layers being greater than or equal to 4 um, and the pixel electrode layer 107 and the shielding layer 105 can overlap in a vertical direction. That is, the projections of the pixel electrode 1071 and the shielding layer 105 projected on the substrate layer 101 at least partially overlap, as in a structure shown in FIG. 3, so the aperture ratio of the pixel can be greatly improved.

The passivation layer 106 is preferably an organic passivation protective layer, and the passivation layer 106 can be made of an organic material having acrylic as a main material.

Preferably, the shielding layer 105 covers at least a portion of an inner surface of the groove 1041 in a conforming manner according to a shape of the groove 1041.

A thickness of the color resist layer 104 in a position where the groove 1041 defined is reduced. That is to say, by having the groove 1041, the color resist layer 104 at the position of the groove 1041 is thinned.

In the display panel, an amount of the coupling capacitance Cpd between the data line 102 and the pixel electrode layer 107 is mainly affected by lateral capacitance. As shown in FIG. 3, the thinner the color resist layer 104 that laterally covers the data line 102, the better the lateral shielding effect of the shielding layer 105 on the data line 102, and therefore the better the shielding effect. Accordingly, the shielding layer 105 covers at least a portion of the inner surface of the groove 1041 in a way conforming to a shape (contours) of the groove 1041 to have a better shielding effect on the data line 102.

Further, the projection of the shielding layer 105 projected on the substrate layer 101 covers at least a portion of the projection of the data line 102 projected on the substrate layer 101, so that the shielding layer 105 has the shielding effect on the data line 102.

Moreover, the projection of the shielding layer 105 projected on the substrate layer 101 covers the whole projection of the data line 102 projected on the substrate layer 101, so as to ensure that the shielding layer 105 fully covers the data line 102 for a better shielding effect.

Referring to FIGS. 1 to 3, the present embodiment has two grooves 1041 which are located above the two sides of the data line 102, respectively. A length of the groove 1041 is equal to a length of the pixel electrode 1071. Since the pixel electrodes 1071 are arranged symmetrically, the two grooves 1041 are also arranged symmetrically.

Further, a depth of the groove 1041 is less than a thickness of the color resist layer 104 located at the two sides of the data line 102.

In other embodiments of the present invention, when there is a special requirement for each pixel unit to adjust the amount of the coupling capacitance on the left and right sides of the data line 102, the number of the grooves 1041 at the two sides of the data line 102 can be different, and positions of the grooves 1041 can also be asymmetric. Moreover, the length of the groove 1041 is not limited to the same length as the pixel electrode 1071, and the groove 1041 can be arranged in sections according to actual needs. Even if there are multiple grooves 1041 at the same side of the data line 102, the grooves 1041 can also have different widths and lengths.

The grooves 1041 can be formed by adjusting the exposure amount in corresponding positions during a manufacturing process of the color resist layer 104.

Specifically, color resists are negative photoresist. At the position where the color resist layer 104 needs to be thinned, that is, at the position where the groove 1041 is formed, a mask has a slit pattern to reduce the exposure in the corresponding position. After development, the groove 1041 is formed. A width of the slit pattern should be less than the resolution of an exposure machine to avoid copying the slit pattern onto the color resist layer 104. In other words, the color resist layer 104 is not completely removed in the corresponding (exposure) position after development, but instead, such the exposure is only reduced in the position corresponding to the slit pattern, thus forming the groove 1041 with a depth less than the thickness of the color resist layer 104 in areas at the two sides of the data line 102.

Further, when the width of the slit pattern is greater than the resolution of the exposure machine, the color resist layer 104 in the position corresponding to the slit pattern is completely reduced and removed. However, in a development process, the color resist layer 104 in the corresponding (exposure) position is gradually removed by means of a developer. If the thickness of the color resist layer 104 is overly reduced or completely reduced, the color resist layer adjacent to a display area may also be thinned to thereby affect chroma of the pixel unit. Therefore, the width, length, and light intensity of the slit pattern can be adjusted, so that the grooves 1041 with various widths, lengths, and different thinning depths can be obtained after exposure and development.

Moreover, the groove 1041 can be formed by means of the slit pattern in the mask as described above, and can also be formed by means of a mask pattern with a different light transmittance at the corresponding position. The present invention is not limited in this regard.

Preferably, the display panel further comprises a protective layer 103 disposed on the substrate layer 101 and covering the data line 102. The protective layer 103 can be made of an insulating material such as silicon oxide and/or silicon nitride. The protective layer 103 covers the data line 102, so that the data line 102 is not affected during a process of forming the color resist layer 104.

Furthermore, the present invention further provides a display device, and the display device comprises the display panel as described above.

In summary, in the display panel and the display device of the present invention, the plurality of grooves are defined in the color resist layer on at least one side of the data line to achieve thinning of the color resist layer, and the shielding layer is disposed above the data line to effectively reduce the coupling capacitance, thereby improving the vertical crosstalk problem of the display panel. The passivation layer is arranged between the shielding layer and the pixel electrode layer to separate the shielding layer from the pixel electrode layer, thereby improving the aperture ratio of the pixel.

The display panel and the display device of the present invention are described in detail as above. Specific examples are used in this disclosure to illustrate the working principles and embodiments of the present invention. The description of the above embodiments is only for ease of understanding the technical solutions and main ideas of the present invention. Those of ordinary skill in the art should understand that they can still modify the technical solutions in the foregoing embodiments, or equivalently replace some of the technical features. Such modifications or replacements should be deemed to be within the scope of the technical solutions of the embodiments of the present invention.

What is claimed is:

1. A display panel, comprising:
   a substrate layer;
   a data line arranged on the substrate layer;
   a color resist layer disposed on the substrate layer, wherein the color resist layer is located at two sides of the data line and comprises a plurality of grooves, and the plurality of grooves are located at least at one side of the data line;
   a shielding layer disposed on the color resist layer and arranged over the data line; and
   a pixel electrode layer arranged over the color resist layer and the shielding layer.

2. The display panel according to claim 1, wherein the color resist layer located at two sides of the data line extends to above the data line to cover the same.

3. The display panel according to claim 2, wherein the display panel comprises one or more than one groove, and the plurality of grooves are at least located above one side of the data line.

4. The display panel according to claim 1, wherein the shielding layer covers at least a portion of an inner surface of the groove in a conforming manner according to a shape of the groove.

5. The display panel according to claim 1, wherein a projection of the shielding layer projected on the substrate layer covers at least a portion of a projection of the data line projected on the substrate layer.

6. The display panel according to claim 5, wherein the projection of the shielding layer projected on the substrate layer covers the whole projection of the data line projected on the substrate layer.

7. The display panel according to claim 1, wherein a depth of the groove is less than a thickness of the color resist layer located at the two sides of the data line.

8. The display panel according to claim 1, wherein the pixel electrode layer comprises a plurality of pixel electrodes, and a projection of the plurality of pixel electrodes projected on the substrate layer at least partially overlaps with a projection of the shielding layer projected on the substrate layer.

9. The display panel according to claim 1, wherein the display panel further comprises a passivation layer which is disposed between the shielding layer and the pixel electrode layer and covers the shielding layer and the color resist layer.

10. The display panel according to claim 1, wherein the display panel further comprises a protective layer which is disposed on the substrate layer and covers the data line.

11. A display device, the display device comprising a display panel, the display panel comprising:
a substrate layer;
a data line arranged on the substrate layer;
a color resist layer disposed on the substrate layer, wherein the color resist layer is located at two sides of the data line and comprises a plurality of grooves, and the plurality of grooves are located at least at one side of the data line;
a shielding layer disposed on the color resist layer and arranged over the data line; and
a pixel electrode layer arranged over the color resist layer and the shielding layer.

12. The display device according to claim 11, wherein the color resist layer located at the two sides of the data line extends to above the data line to cover the same.

13. The display device according to claim 12, wherein the display device comprises one or more than one groove, and the plurality of grooves are at least located above one side of the data line.

14. The display device according to claim 11, wherein the shielding layer covers at least a portion of an inner surface of the groove in a conforming manner according to a shape of the groove.

15. The display device according to claim 11, wherein a projection of the shielding layer projected on the substrate layer covers at least a portion of a projection of the data line projected on the substrate layer.

16. The display device according to claim 15, wherein the projection of the shielding layer projected on the substrate layer covers the whole projection of the data line projected on the substrate layer.

17. The display device according to claim 11, wherein a depth of the groove is less than a thickness of the color resist layer located at the two sides of the data line.

18. The display device according to claim 11, wherein the pixel electrode layer comprises a plurality of pixel electrodes, and a projection of the plurality of pixel electrodes projected on the substrate layer at least partially overlaps with a projection of the shielding layer projected on the substrate layer.

19. The display device according to claim 11, wherein the display panel further comprises a passivation layer which is disposed between the shielding layer and the pixel electrode layer and covers the shielding layer and the color resist layer.

20. The display device according to claim 11, wherein the display panel further comprises a protective layer which is disposed on the substrate layer and covers the data line.

* * * * *